United States Patent [19]
Giapis et al.

[11] Patent Number: 5,124,216
[45] Date of Patent: Jun. 23, 1992

[54] METHOD FOR MONITORING PHOTORESIST LATENT IMAGES

[75] Inventors: Konstantinos P. Giapis, Athens, Greece; Richard A. Gottscho, Maplewood; Christian A. Green, Long Valley, both of N.J.

[73] Assignee: AT&T Bell Laboratories, Murray Hill, N.J.

[21] Appl. No.: 560,712

[22] Filed: Jul. 31, 1990

[51] Int. Cl.⁵ ............................................. G03F 7/20
[52] U.S. Cl. ...................................... 430/30; 430/945; 356/354
[58] Field of Search .................. 430/30, 945; 356/354, 356/445, 447

[56] References Cited

U.S. PATENT DOCUMENTS

| | | | |
|---|---|---|---|
| 4,142,107 | 2/1979 | Hatzakis et al. | 430/30 |
| 4,500,615 | 2/1985 | Iwai | 430/30 |
| 4,851,311 | 7/1989 | Millis et al. | 430/30 |

Primary Examiner—Marion E. McCamish
Assistant Examiner—Kathleen Duda
Attorney, Agent, or Firm—Glen E. Books

[57] ABSTRACT

The formation of latent images in photoresist can be monitored during exposure without spurious images by directing a pulsed beam of monochromatic light onto a region of the layer being exposed and selectively detecting the diffracted light. Peak formation in the normalized diffracted intensity versus time curve indicates optimal exposure of the resist.

7 Claims, 3 Drawing Sheets

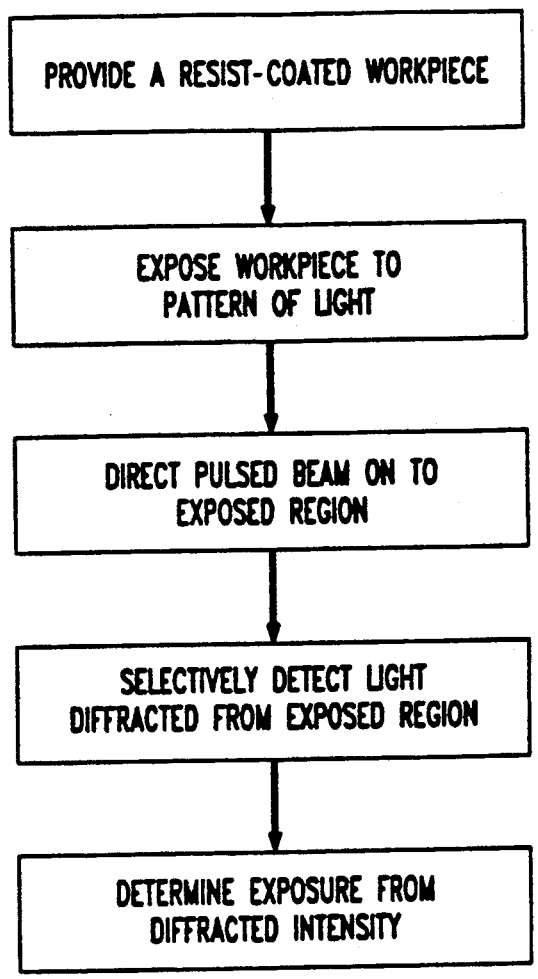
FIG. 1
FIG. 3
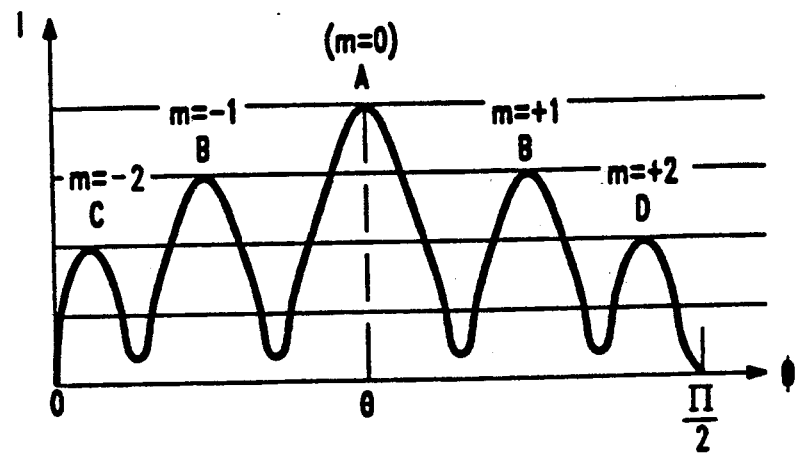

METHOD FOR MONITORING PHOTORESIST LATENT IMAGES

FIELD OF THE INVENTION

The present invention relates to photolithography and, more particularly, to a method for monitoring, during exposure, the formation of a latent image in a layer of photoresist.

BACKGROUND OF THE INVENTION

Photolithography using photoresists is of considerable commercial importance in the manufacture of semiconductor devices such as integrated circuits. In typical semiconductor manufacture, a semiconductor workpiece such as an oxide covered silicon wafer is coated with a thin layer of photoresist. Selected regions of the resist-covered wafer are then exposed to light, as by passing light through a mask onto the wafer. Because the resist is photosensitive, a latent image corresponding to the exposure pattern forms in the resist layer. This latent image is developed, producing a resist mask on the underlying wafer. The mask exposes only selected areas of the wafer to chemical action, such as etching of the oxide coating, or to doping, as by ion implanatation.

There are two general types of phototresist: positive-working and negative-working. A positive resist becomes more soluble in developer upon exposure to ultraviolet light and exposed regions are washed away. A negative resist, in contrast, becomes less soluble after exposure, and the non-exposed regions are washed away.

As semiconductor technology advances to smaller and smaller devices, monitoring and fine control of the resist exposure becomes increasingly important. For positive resist, underexposure unduly broadens fine lines and, in the production of conductive regions of an integrated circuit, underexposure can limit minimum size and even produce unwanted short circuits. Similarly, overexposure can produce unwanted open circuits.

In an effort to provide better control of the exposure process, others have attempted to monitor the formation of latent images in photoresist by monitoring the light scattered by the latent image of a diffraction pattern. Preliminary results using a continuous red, helium-neon laser to monitor formation of 1.7 micron grating have been reported. As the latent image forms, it acts increasingly like a diffraction grating with a peak at the first order diffraction angle. The photoresist, which is exposed by an ultraviolet source, does not absorb red light from the laser.

This experimental approach, however, encounters technical difficulties with the smaller dimensions of leading edge technology. As linewidths approach submicron dimensions, both the spacing of the test gratings and the wavelength of the laser must become smaller and smaller. Specifically, the wavelength must be less than twice the grating spacing. But for many resists light at such short wavelengths is increasingly absorbed by the resist, producing spurious images in the photoresist and thus interfering with the parameter to be monitored.

Reducing the intensity of the monitoring radiation to levels so low that they do not expose the photoresist also reduces the signal-to-noise ratio. As a result it is extremely difficult to extract useful information from the diffracted beam. Thus a new approach is required.

SUMMARY OF THE INVENTION

The present applications have discovered that latent images in photoresist, including submicron latent images, can be monitored during exposure. Specifically, a workpiece having a surface coated with photoresist is exposed to a pattern of ultraviolet light, and during the exposure, a pulsed beam of monochromatic light is directed onto the region being exposed to ultraviolet light. Light from the pulsed beam diffracted from the exposed region is selectively detected. This method permits use of sufficiently high intensity beams to provide useful information concerning submicron latent images while maintaining a cumulative exposure below that required to produce spurious latent images in the resist. Optimal exposure for a given application can then be correlated with the peak of diffracted light intensity as a function of time, providing indicia for automatic exposure control.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 1 is a flow diagram showing the steps of a preferred method for monitoring latent images in accordance with the invention;

FIG. 3 is a graphical illustration showing the qualitative features of intensity versus scattering angle for the monitoring apparatus of FIG. 1.

Figure 2:
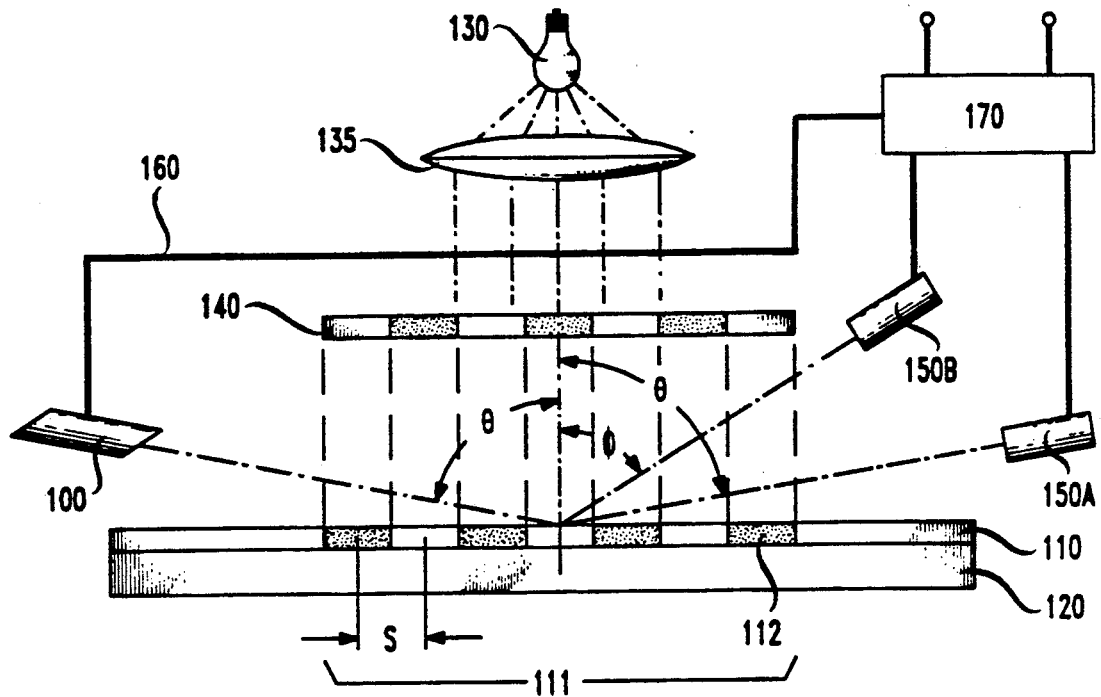
FIG. 2 is a schematic illustration of apparatus for monitoring resist latent images in accordance with the one embodiment of the invention.

It is to be understood that these drawings are for purposes of illustrating the concepts of the invention and are not to scale.

DETAILED DESCRIPTION

Referring to the drawings, FIG. 1 is a flow diagram illustrating the steps of a preferred method for monitoring photoresist latent images in accordance with the invention. As shown, the first step is to provide a resist-coated workpiece such as a conventional silicon wafer having a thin layer of photoresist spun onto a major surface. The photoresist can be a conventional, commercially available resist such as Microposit S-1400-3 photoresist distributed by Shipley Co., Inc., Newton, Mass. The resist layer will typically have a uniform thickness in the range of a few hundred to several thousand angstroms.

The next step shown in FIG. 1 is to form a latent image in the photoresist as by exposing the workpiece to a pattern of light. The light is typically ultraviolet with a wavelength of a few thousand angstroms. The light is projected onto the workpiece in a desired pattern as by projecting through a mask to selectively expose a desired pattern in the workpiece. An alternative approach used, for example, to make diffraction gratings, exposes the workpiece to a pattern of light by forming an interference pattern on the workpiece. Typical exposure times are on the order of a few minutes to less than a minute. In other approaches known to those skilled in the art, the latent images can be formed by a scanning laser beam or a scanning electron beam.

The next step, which can take place simultaneously with exposure, is to direct a pulsed beam of monochromatic light onto the region of the workpiece that is being exposed. The pulsed monitoring beam has a wavelength less than about twice the minimum line spacing in the exposure pattern. The duty cycle, beam cross section and beam intensity are chosen in relation to the absorption spectrum of the photoresist so that the total exposure from the monitoring beam is substantially less than would produce a developable image in the resist. In typical applications for monitoring submicron line spacings, the beam source can be a 0.2 microjoule dye laser with a wavelength of 2600 angstroms, a pulse duration of 10 nanoseconds, a duty cycle of $2 \times 10^{-7}$ and a cross section of 1 $cm^2$. With such parameters, the beam can be used to monitor the resist during exposure of several minutes while providing less than 10% of the exposure required to produce a developed line.

As illustrated in FIG. 1, light from the monitoring beam diffracted from the exposed region of the workpiece is selectively detected. Both wavelength and temporal selection can be effected. Detectors can be selectively responsive to the wavelength of the monitoring beam or light filters can be provided for removing light of other wavelengths such as the exposing light. In addition, the detectors or their outputs are preferably gated to the source of the pulsed monitoring beam so that either the detectors operate only when the beam is "on" or their output is measured only when the beam is on.

The final step, which can also occur simultaneously with exposure, is analyzing the characteristics of the diffracted beam to provide a measure of the level of exposure of the photoresist. Such analysis can be provided by a peak detector or a slope detector responsive to the normalized diffracted intensity (normalized to incident or reflected intensity) versus time. As the normalized diffracted intensity approaches a maximum, the exposure of the photoresist approaches an optimum level.

Figure 5:
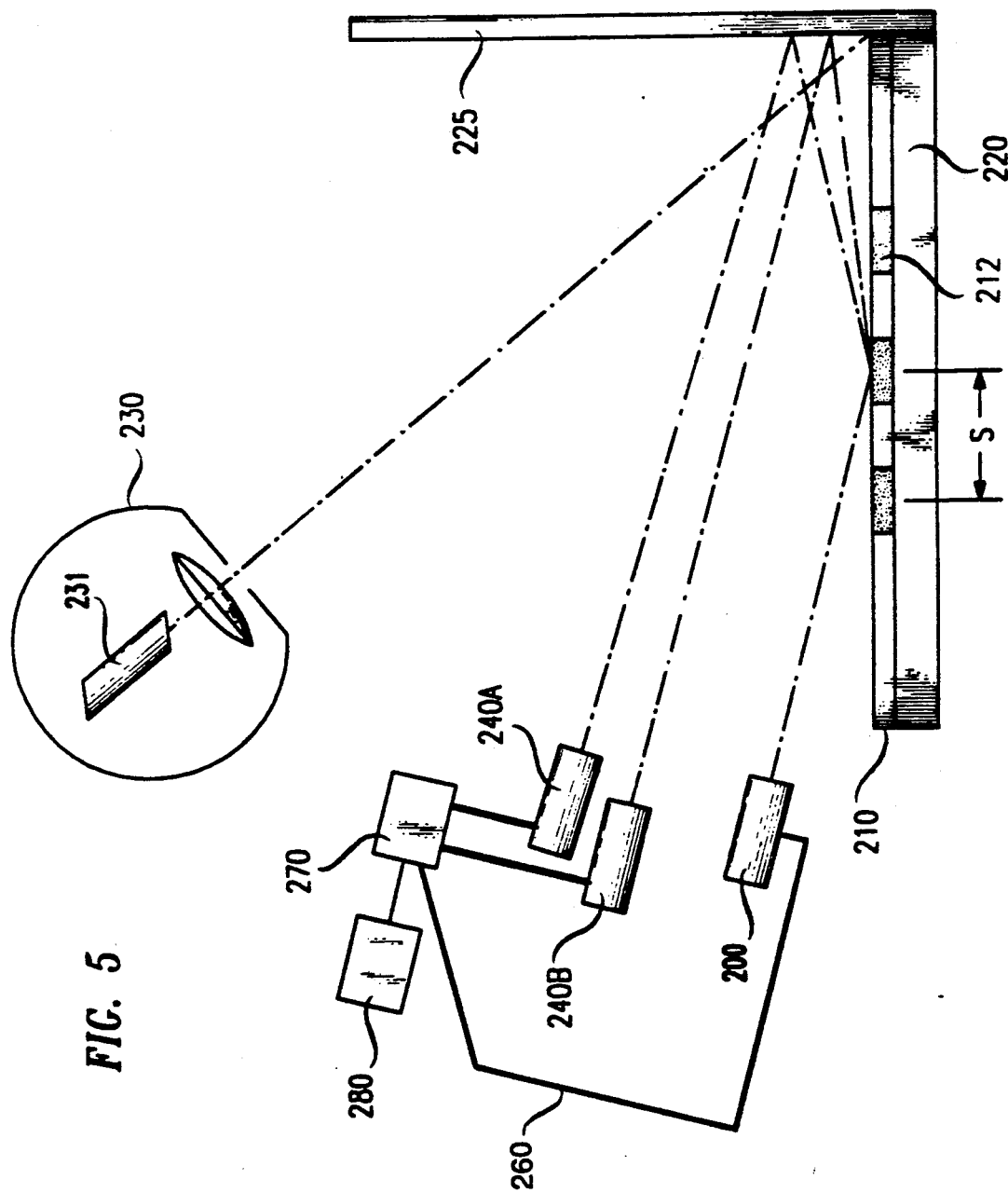
FIG. 5 is a schematic illustration of a preferred embodiment of the invention used in the fabrication of a distributed feedback semiconductor laser.

The implementation of this process will be seen more clearly by reference to FIGS. 2 and 5 which illustrate apparatus for monitoring resist latent images in accordance with the invention. In FIG. 2, the apparatus comprises a pulsed laser 100 for generating a pulsed beam of coherent light, and means (not shown) such as adjustable laser mounting for directing the pulsed beam onto a resist layer 110 at a preselected region 111 containing latent images 112. The images 112 may have minimum dimensions of less than a micron. In typical applications, resist layer 110 is disposed on a substrate 120 such as a semiconductor wafer, and the latent images 112 are in the process of being formed as by exposure of the resist to ultraviolet light from a source 130 through collimating lens 135 and a projection mask 140. Such exposure alters the absorption and index of refraction of the exposed resist as a function of exposure time, thereby creating a detectable latent image.

One or more detectors 150A and 150B are disposed and oriented for receiving light from laser 100 scattered from region 111 of the resist layer 110. Preferably one of the detectors 150A is positioned to receive light reflected from region 111, and another detector 150B is positioned to receive light diffracted from region 111.

In preferred embodiments, region 111 is a grating region of spaced lines having equal spacings S of less than one micron. The photoresist layer 110 has a thickness on the order of a few hundred angstroms, and the pulsed laser 100 has a wavelength of less than twice the center-to-center line spacing S. The detectors 150A and 150B are preferably photomultipliers. Conveniently, the outputs of detectors 150A and 150B are applied to a comparison circuit 170 for producing a normalized output signal commensurate with the ratio between the diffracted intensity and the intensity of the monitoring beam for periods when the beam is "on". To effectuate this result, circuit 170 is preferably gated to laser 100 by conductor 160 in accordance with gating arrangements well known in the art so that measurements are compared only during laser pulses.

The latent images 112, consisting of a pattern of variations in the optical index of refraction in the resist layer, operate on the laser beams as one or more superimposed diffraction gratings, producing a characteristic distribution of scattered light intensity I versus angle $\phi$ from the normal. In general, scattered light intensity is a function of spatial frequency $$f = \frac{m\lambda}{S} = \sin\theta - \sin\phi$$

where S is the grating spacing in microns, $\theta$ and $\phi$ are the incident and scattered angles, $\lambda$ is the laser wavelength in microns and m is an integer $m = 0, \pm 1, \pm 2 \ldots$ known as the order number. FIG. 3 is a graphical illustration showing the qualitative features of this distribution when the latent image is a plurality of equally spaced lines forming a single grating. As shown, the highest intensity peak is the reflection peak A corresponding to $m = 0$. The second highest peaks are the first order diffraction peaks B, corresponding to $m = \pm 1$. Higher order diffraction peaks C, D, etc. may be produced, depending on the wavelength of the laser beams as compared with the line spacing. In the preferred practice of the invention, the latent image is monitored by a shallow angle incident beam, e.g. $\theta$ approximately 80°.

Figure 4:
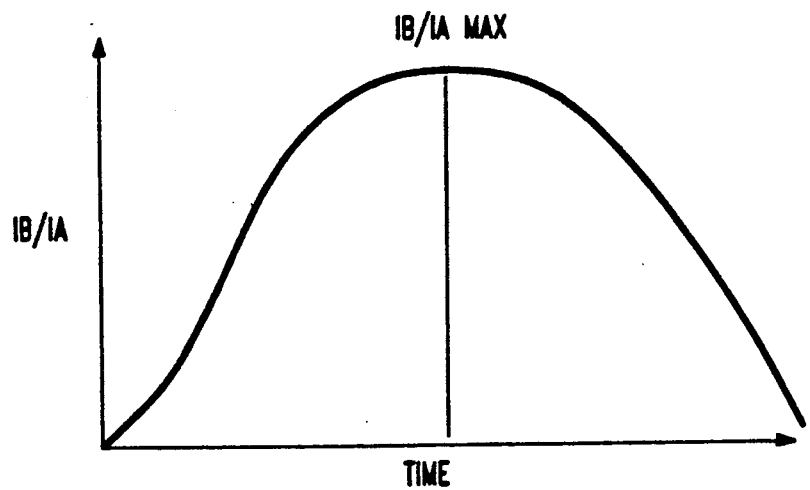
FIG. 4 is a graphical illustration showing the qualitative features of diffraction peak intensity versus exposure time for the monitoring apparatus of FIG. 1.

The changes in absorption and index of refraction in the latent images varies with exposure to ultraviolet light from source 130. This variation in index of refraction, in turn, varies the intensity light from laser 100 scattered by the latent image pattern, and this variation in scattered light intensity can be used to measure the extent of exposure. FIG. 4 is a graphical illustration showing the qualitative features of the intensity of a normalized diffraction peak, e.g. peak B of FIG. 3, plotted as a function of exposure time for the apparatus of FIG. 2. As can be seen from FIG. 4, the diffraction intensity begins substantially at zero and, with increasing exposure time, increases to a maximum value. Thereafter, the intensity begins to decrease with increasing exposure. It has been found that the initial region of increasing intensity with time corresponds to under-exposure of the photoresist, maximum intensity corresponds to optimum exposure, and the region of decreasing intensity with time corresponds to overexposure.

With but minor modification, the process of FIG. 1 and the apparatus of FIG. 2 can be used to monitor the development of an exposed image in photoresist. In this instance, the resist-coated workpiece has already been exposed so instead of being exposing to a pattern of light, it is exposed to a developing agent, such as Shipley 352 Developer or Shipley 452, and simultaneously the developing image is monitored as previously described.

FIG. 5 is a schematic illustration of a preferred embodiment of apparatus used to monitor the formation of a submicron grating structure, such as is typically formed on a distributed feedback semiconductor laser. In this arrangement the substrate 220 is typically a heterojunction semiconductor laser having thin resist layer 210 approximately 400 angstroms thick. The resist-coated substrate is exposed to a pattern of varying light intensity not through a mask but rather by exposing it to an interference pattern. Specifically, the coated substrate 220 is disposed on a mount angularly displaced from a reflector 225 and both the reflector and the substrate are exposed to monochromatic ultraviolet light from a pinhole source 230 so that the reflected light and the direct light form an interference pattern 212 on the photoresist layer. In the preferred arrangement, the angular displacement between the substrate 220 and the reflector 225 is 90°. The pinhole source 230 preferably comprises a HeCd laser 231 with wavelength of about 3250 angstroms. The resulting interference pattern on the photoresist has intensity peaks separated by a center-to-center spacing S of about 2500 angstroms. Optical exposure of the photoresist, upon development, produces a pattern of resist lines spaced apart by one line width (i.e. the grating structure has a 50% duty cycle.)

In accordance with the invention, resist exposure in this apparatus is monitored by a pulsed laser 200 of wavelength 2600 Å directing a pulsed beam on to the resist layer 210. Preferably laser 200 is a 0.2 microjoule laser with a pulse duration of about 10 nanoseconds and a beam cross section of about 1 cm². First detecting means such as photomultiplier 240A is disposed for providing an output proportionate to the reflected beam intensity and second photomultiplier 240B is disposed for providing an output proportionate to the intensity of the diffracted beam. The outputs of detectors 240A and 240B are applied to a comparison circuit 270 for producing an output proportionate to the normalized diffracted intensity. Circuit 270 is preferably gated to laser 200 via conductor 260 so that measurements are compared only when laser 200 is "on". The output of the comparison circuit can be applied to a peak detecting circuit 280 for determining the point in time when the normalized diffracted intensity reaches a peak. Exposure from source 230 can then be automatically terminated in relation to peak detection to secure optimal exposure. The resist is then developed and the desired diffraction grating is etched in the substrate in accordance with techniques well known in the art of photolithography.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. A method for monitoring the formation of a latent image in a layer of photoresist comprising the steps of:
   providing a workpiece having a surface coated with photoresist;
   exposing said photoresist to form a latent image in a region thereof,
   during exposure directing onto said region of said photoresist a pulsed beam of monochromatic light having a duty cycle, beam cross section and beam intensity such that total exposure from said pulsed beam is less than would produce a developable image in the resist; and
   selectively detecting light from said pulsed beam diffracted from said region of said photoresist.

2. The method according to claim 1 wherein light from said pulsed beam is selectively detected only during periods when said beam is pulsing.

3. The method according to claim 1 wherein the energy per unit area of said pulsed beam of monochromatic light is less than 10% of the energy required to provide a developable image on said photoresist.

4. The method according to claim 1 wherein said latent image is formed by exposing said photoresist coated surface to a pattern of light by projecting ultraviolet light through a mask.

5. The method according to claim 1 wherein said latent image is formed by exposing said photoresist coated surface to a pattern of light by forming an interference pattern on said coated surface.

6. The method according to claim 5 further comprising the step of stopping formation of said latent image upon detection of said peak of diffracted light intensity.

7. The method according to claim 1 further comprising the step of detecting the occurrence of a peak of diffracted light intensity as a function of time.

* * * * *